(12) United States Patent
Chen

(10) Patent No.: US 6,828,543 B1
(45) Date of Patent: Dec. 7, 2004

(54) FLIP CHIP PACKAGE STRUCTURE FOR AN IMAGE SENSOR AND AN IMAGE SENSE MODULE WITH THE FLIP CHIP PACKAGE STRUCTURE

(76) Inventor: Wen-Ching Chen, P.O. Box 2103, Taichung (TW)

( * ) Notice: Subject to any disclaimer, the term of this patent is extended or adjusted under 35 U.S.C. 154(b) by 0 days.

(21) Appl. No.: 10/662,432

(22) Filed: Sep. 16, 2003

(51) Int. Cl.$^7$ .......................... H01L 27/00; H01L 23/48
(52) U.S. Cl. .................... 250/208.1; 250/239; 257/435; 257/778
(58) Field of Search ................................ 250/208.1, 239, 250/216; 257/433, 435, 692, 693, 734, 778–780; 438/108, 125

(56) References Cited

U.S. PATENT DOCUMENTS 6,342,406 B1 * 1/2002 Glenn et al. ................. 438/57

2004/0056365 A1 * 3/2004 Kinsman ..................... 257/778
2004/0056971 A1 * 3/2004 Yang et al. .................. 348/294

* cited by examiner

Primary Examiner—Kevin Pyo
(74) Attorney, Agent, or Firm—Rosenberg, Klein & Lee

(57) ABSTRACT

An image sense module includes a semi-conductor image sense chip having a top face attached to a bottom face of a glass plate and multiple electric contacts formed on the semi-conductor image sense chip. A conductive interconnection circuit is formed on the bottom face of the glass plate. The conductive interconnection circuit has multiple first solder points each electrically connected to a corresponding one of the electric contacts of the semi-conductor image sense chip and multiple second solder points formed on one side of the glass plate. A lens set is secured on the glass plate. The lens set includes a holder perpendicularly attached to a top face of the glass plate and having a skirt downward extending from the holder. A channel is defined in one side of the skirt for allowing the conductive interconnection circuit extending through the holder.

13 Claims, 6 Drawing Sheets

FLIP CHIP PACKAGE STRUCTURE FOR AN IMAGE SENSOR AND AN IMAGE SENSE MODULE WITH THE FLIP CHIP PACKAGE STRUCTURE

BACKGROUND OF THE INVENTION

1. Field of the Invention

The present invention relates to a flip chip package structure and an image sense module, and more particularly to a flip chip package structure for an image sensor and an image sense module with the flip chip package structure.

2. Description of Related Art

The current package technology of an image sensor usually use the ceramic leaded chip carrier (CLCC) or plastic leaded chip carrier (PLCC) that needs the processes of embedding a die pad and wire bonding. However, the number of I/O pins of an electric element become great, the thickness of the electric element becomes thin and the volume of the electric element becomes small under the requests of a slight weight, multi-function and a quick process speed. Consequently, the conventional solder technology is limited due to the diameter of the holes in the PCB for receiving the leads of electric parts. The surface mounting technology (SMT) is provided to overcome the problem of the conventional solder technology. However, the PCB cannot be used to load the current thin lead such that the leads of electric parts are arranged in an array type for enhancing the yield of manufacturing. However, a hollow solder and a curve PCB is occurred after soldering according to great number I/O leads and a small package volume. To solve the above problem is to lessen the volume of the jelly on the chip as small as possible.

As described above, the chip package technology trends have been toward flip chip package structure. The process of flip chip package needs to grow multiple bumps on the wafer and each bump is electrically connected to the circuit on a PCB such that the top of each of the bumps faces the PCB and the prerequisite condition of an open sensing area of the image sensor is limited. Consequently, the flip chip has a good electric property, heat dissipation and a small packaged size, but it is difficult to use the technology of flip chip on an image sensor very well.

A conventional flip chip package structure of an image sensor in accordance with the prior art shown in FIG. 10 comprises a glass plate (91) including an inner face forming a circuit (910) on the inner face of the glass plate (91) by etching. A chip (92) is soldered on the circuit near a middle portion of the glass plate (91) by using first tin balls (93) and the technology of flip chip. The circuit (910) of the glass plate (91) has two opposite sides each having a second tin ball (94) for surface mounting of the circuit (910). The diameter of each of the second tin balls (94) must be greater than the thickness of the chip (92) for a good reliability. For a suitable interval between the two second tin balls (94), the area of the glass plate (91) must be enlarged. Consequently, the enlarged glass plate enlarges the volume of the image sensor. The type of conventional flip chip package structure needs to be advantageously altered.

The present invention has arisen to mitigate and/or obviate the disadvantages of the conventional flip chip package structure.

SUMMARY OF THE INVENTION

The main objective of the present invention is to provide an improved flip chip package structure for an image sensor and an image sense module with the flip chip package structure.

To achieve the objective, the image sense module in accordance with the present invention comprises a semi-conductor image sense chip having a top face attached to a bottom face of a glass plate and multiple electric contacts formed on the semi-conductor image sense chip. A conductive interconnection circuit is formed on the bottom face of the glass plate. The conductive interconnection circuit has multiple first solder points each electrically connected to a corresponding one of the electric contacts of the semi-conductor image sense chip and multiple second solder points formed on one side of the glass plate. The multiple second solder points are adapted to be electrically connected to a printed circuit. A lens set is secured on the glass plate. The lens set includes a holder perpendicularly attached to a top face of the glass plate and having a skirt downward extending from the holder. A channel is defined in one side of the skirt for allowing the conductive interconnection circuit extending through the holder.

Further benefits and advantages of the present invention will become apparent after a careful reading of the detailed description with appropriate reference to the accompanying drawings.

DETAILED DESCRIPTION OF THE INVENTION

Figure 1:
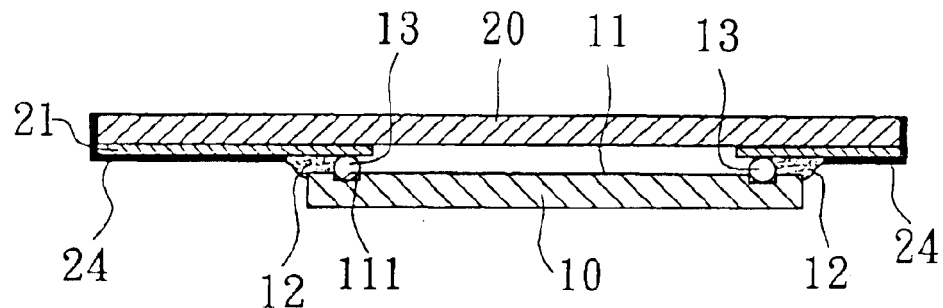
FIG. 1 is a side cross-sectional view of a first embodiment of a flip chip package structure for an image sensor in accordance with the present invention.

Referring to the drawings and initially to FIG. 1, a flip chip package structure (1) for an image sensor in accordance with the present invention comprises a semi-conductor image sense chip (10) having a top face (11) attached to a bottom face of a glass plate (20). A periphery between the semi-conductor image sense chip (10) and the glass plate (20) is underfilled with jelly-like material (12) for forming an airtight condition between the semi-conductor image sense chip (10) and the glass plate (20). Multiple bonding pads (111) are formed on the top face (11) of the semi-conductor image sense chip (10). A metal soldering ball (13) is planted with a corresponding one of the multiple bonding pads (111) on the semi-conductor image sense chip (10). In the preferred embodiment of the present invention, the metal soldering ball (13) is a tin ball.

A conductive interconnection circuit (21) is formed on the bottom face of the glass plate (20) and multiple first solder points (22) each electrically connected to a corresponding one of the multiple bonding pads (111).

Figure 3:
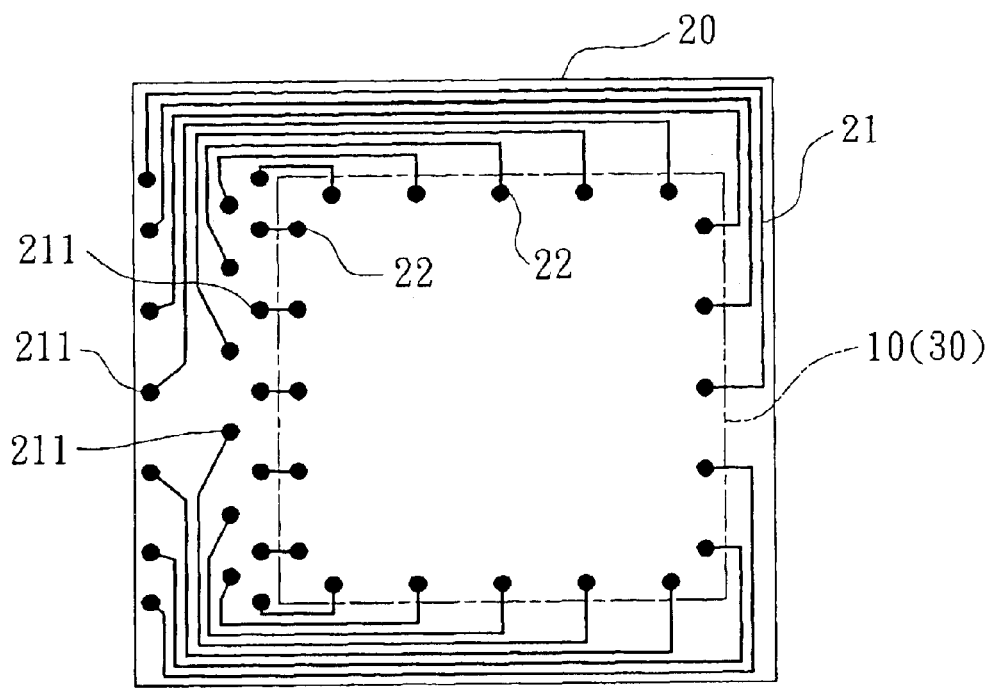
FIG. 3 is a bottom plan view of a glass plate of the flip chip package structure of the present invention for showing a conductive interconnection circuit thereon.

With reference to FIG. 3, the conductive interconnection circuit (21) forms multiple second solder points (211) on one side of the bottom face of the glass plate (20).

The periphery and the bottom face of the glass plate (20) are covered with an opaque mask (24). The opaque mask (24) has a through hole (not numbered) defined for allowing the semi-conductor image sense chip (10) extending through the opaque mask (24). The opaque mask (24) can prevent the light from entering the glass plate (20) and influencing the quality of the collected image from the semi-conductor image sense chip (10), and form an airtight condition around the semi-conductor image sense chip (10).

Figure 2:
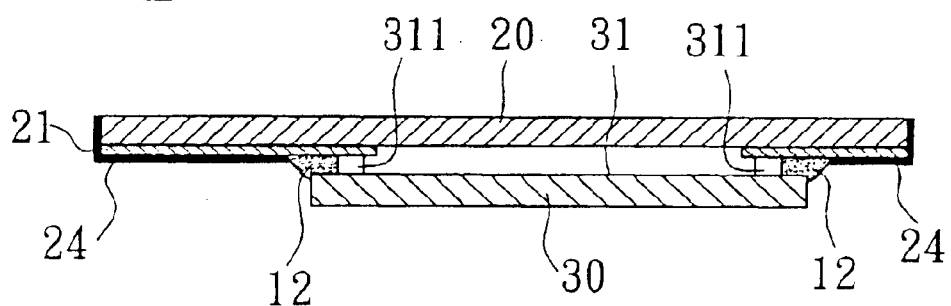
FIG. 2 is a side cross-sectional view of a second embodiment of a flip chip package structure for an image sensor in accordance with the present invention.

With reference to FIG. 2 that shows a second embodiment of the flip chip package structure (3) for an image sensor of the present invention, a second embodiment of the flip chip package structure for an image sensor comprises a semi-conductor image sense chip (30) having a top face (31) attached to a bottom face of a glass plate (20). A periphery between the semi-conductor image sense chip (30) and the glass plate (20) is underfilled with jelly-like material (12) for forming an airtight condition between the semi-conductor image sense chip (30) and the glass plate (20). The top face (31) of the semi-conductor image sense chip (30) grows multiple bumps (311) thereon.

The glass plate (20) has a conductive interconnection circuit (21) formed on the bottom face thereof. The conductive interconnection circuit (21) formed multiple first solder points (22) each aligning with a corresponding one of the multiple bumps (311). Each first solder points (22) is electrically connected to the corresponding one of the multiple bumps (311) by solder reflow technology. Further with reference to FIG. 4, the conductive interconnection circuit (21) has multiple second solder points (211) formed on one side of the bottom face of the glass plate (20).

The periphery and the bottom face are covered with an opaque mask (24). The opaque mask (24) has a through hole (nor numbered) defined for allowing the semi-conductor image sense chip (30) extending through the through hole. The opaque mask (24) can prevent the light from entering the glass plate (20) and influencing the quality of the collected image from the semi-conductor image sense chip (30), and form an airtight condition around the semi-conductor image sense chip (30).

Figure 5:
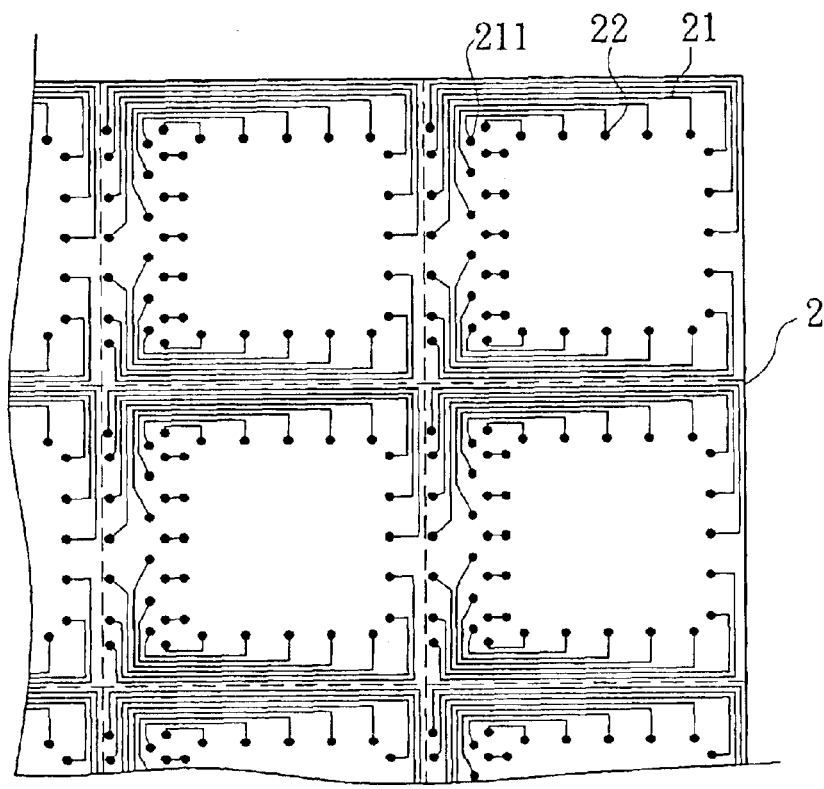
FIG. 5 is a bottom plan view of a big glass plate on which multiple conductive interconnection circuits are formed.
Figure 6:
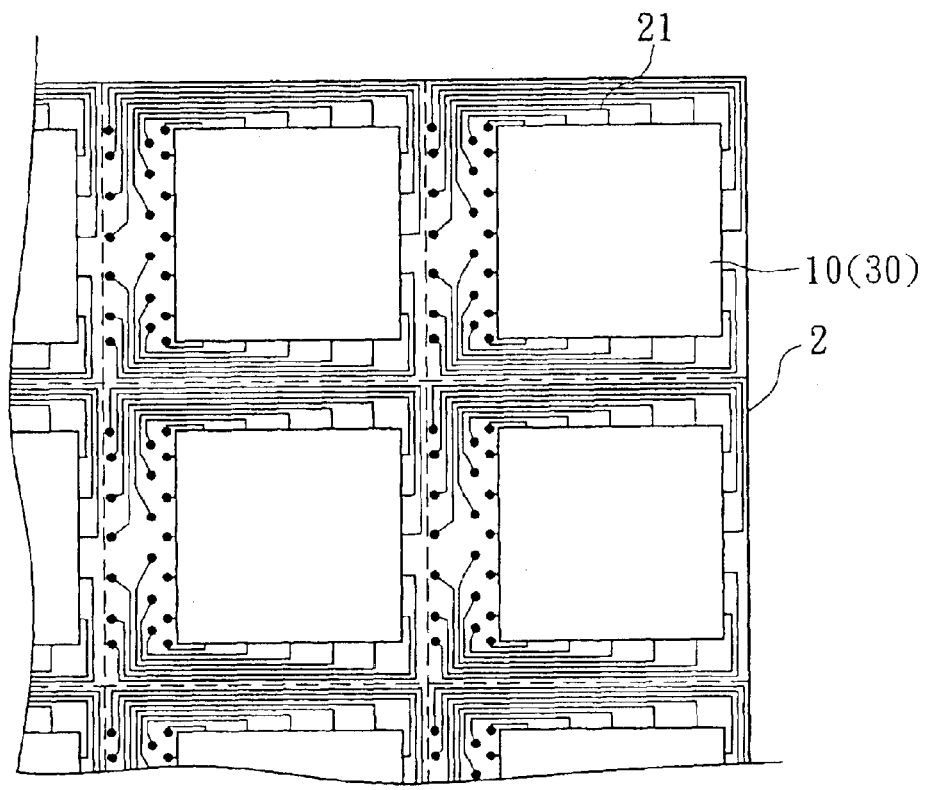
FIG. 6 is a bottom plan view of the big glass plate on which a chip is soldered on each of the multiple conductive interconnection circuits in FIG. 5.

With reference to FIG. 5, the manufacturing process of the two above embodiments of the flip chip package structure for an image sensor is to divide a great glass plate (2) into multiple areas each forms a conductive interconnection circuit (21) thereon. With reference to FIG. 6, a semi-conductor image sense chip (10)/(30) is soldered on the multiple first solder points (22) by the way of flip chip and using SMT package equipment to make multiple solder points (22) being electrically connected to the multiple bonding pads (111)/bumps (311).

The opaque mask (24) is not absolutely necessary to the present invention. To mount or not to mount an opaque mask (24) is in accordance with the downstream products of the flip chip package structure.

According to the flip chip package structure as shown in FIGS. 1 and 2, the conductive interconnection circuit (21) can be disposed in a very narrowed width, and has a volume very close to that of the chip scale package (CSP) in a slight thickness because the conductive connection circuit (21) is formed by etching technology. Furthermore, the second solder points (211) can be greatly used to be soldered to a flexible printed circuit (FPC) and the second solder points (211) has an enlarged distance for enhancing the reliability of solder of the circuit board under a suitable design.

Figure 4:
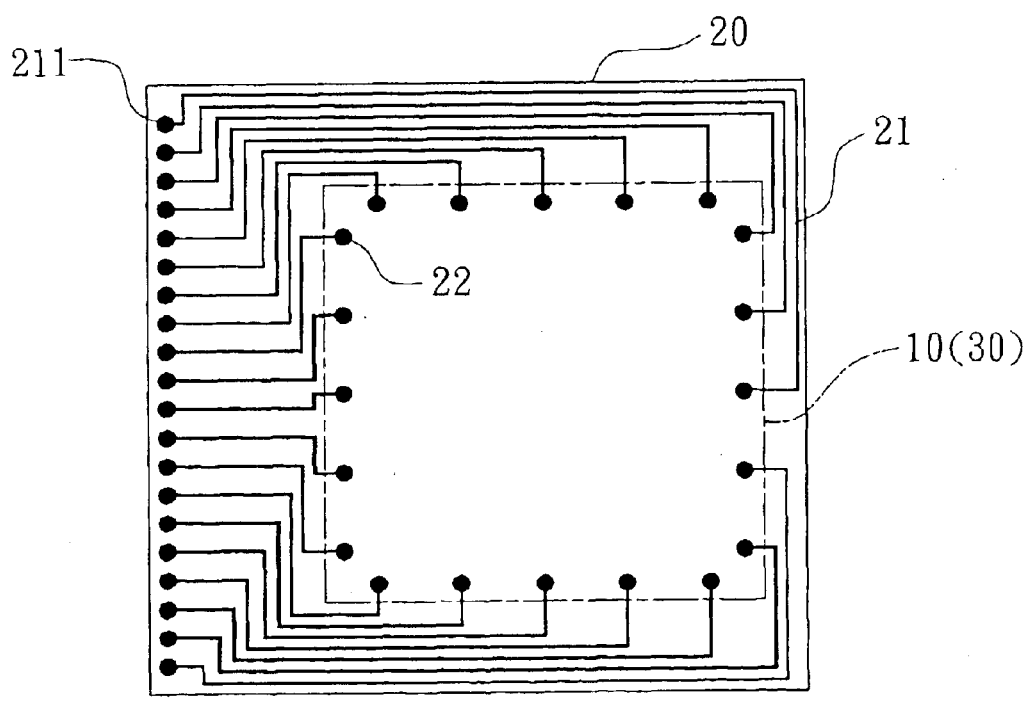
FIG. 4 is another embodiment of the conductive interconnection circuit on the glass plate of the present invention.

The second solder points (211) can be designed to different embodiments. With reference to FIG. 3, the second solder points (211) are arranged separately juxtaposed relative to one another. With reference to FIG. 4, the second solder points (211) are arranged in an array that can prevent the leads of the conductive interconnection circuit (21) from being soldered in a high density and reducing the reliability of soldering the FPC.

Figure 7:
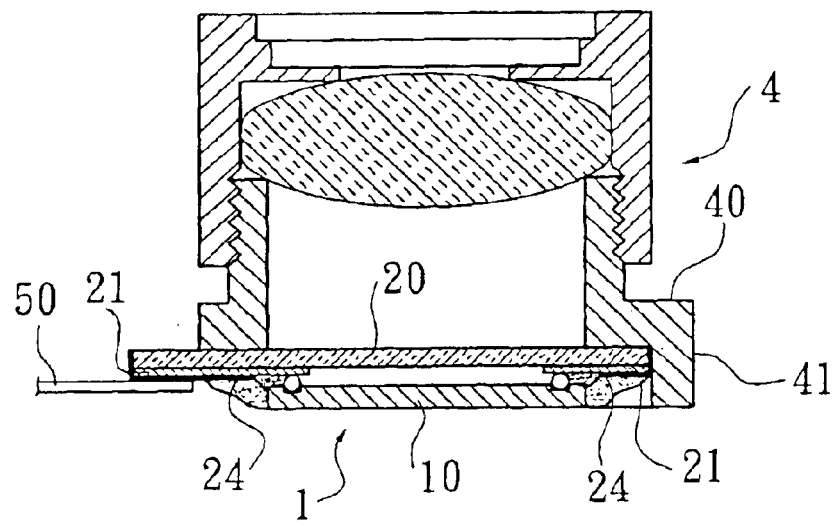
FIG. 7 is a side cross-sectional view of an image sense module with the flip chip package structure in FIG. 1.
Figure 8:
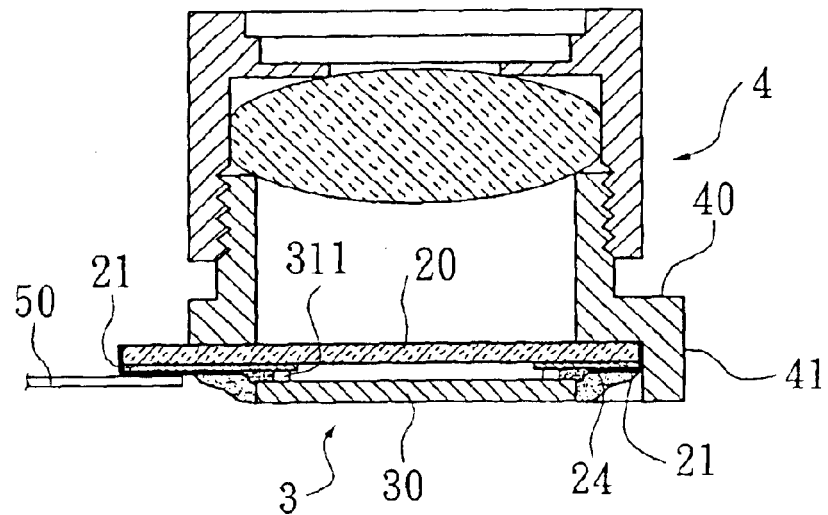
FIG. 8 is a side cross-sectional view of an image sense module with the flip chip package structure in FIG. 2.
Figure 9:
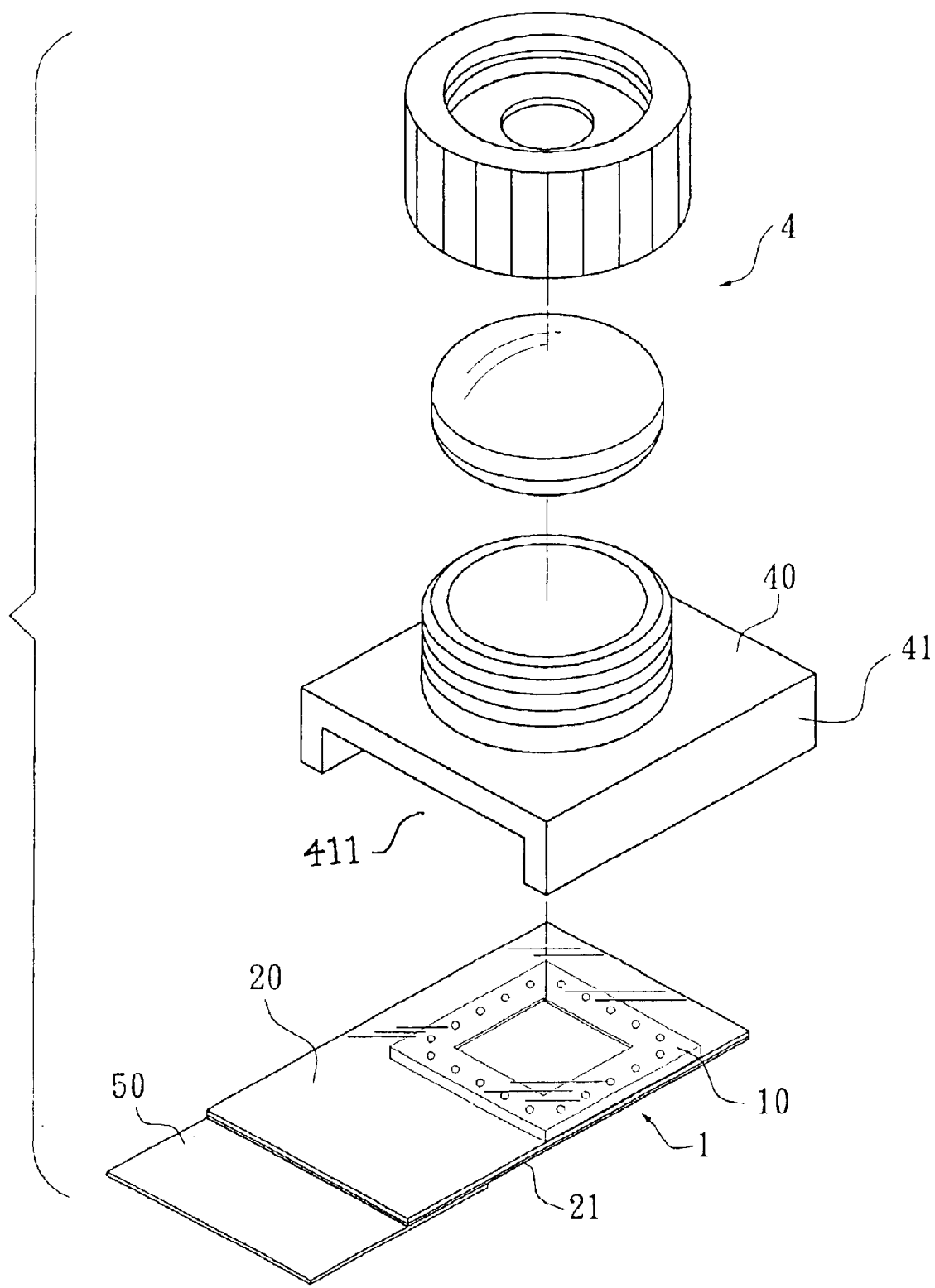
FIG. 9 is an exploded perspective view of the image sense module in FIG. 7.
Figure 10:
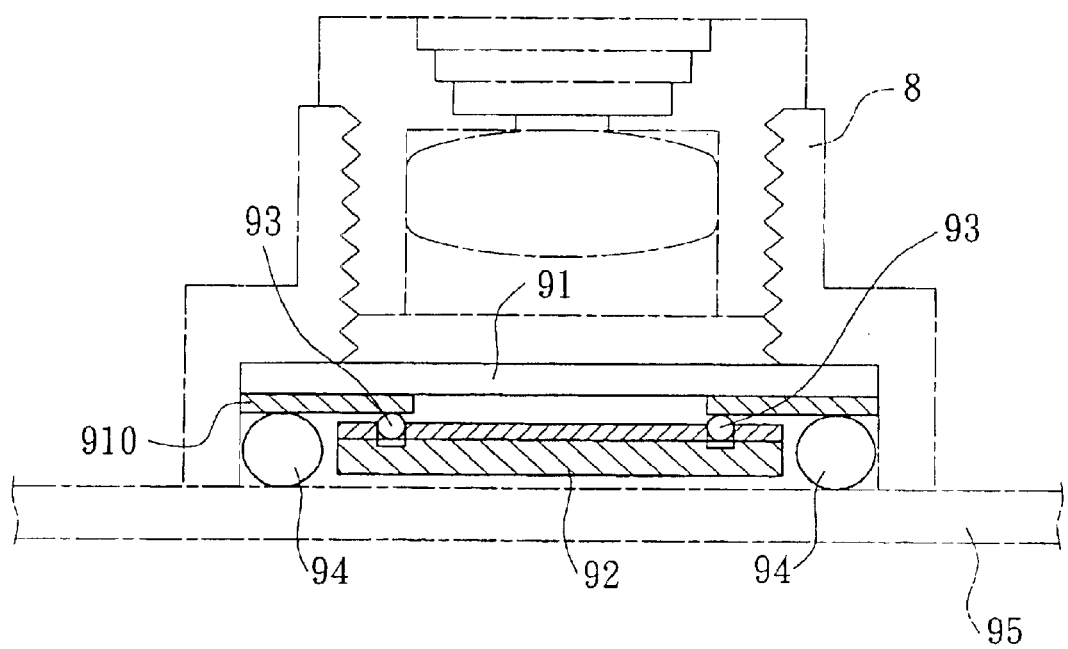
FIG. 10 is a side cross-sectional view of a conventional chip package structure in accordance with the prior art.

With reference to FIGS. 7–9, the flip chip package structure (1)/(3) in accordance with the present invention can be used to an image sense module. The image sense module comprises a lens set (4) secured on the flip chip package structure. The lens set (4) includes a holder (40) perpendicularly attached to a top face of the glass plate (20) and having a skirt (41) downward extending from the holder (40). A channel (411) is defined in one side of the skirt (41) for allowing the conductive interconnection circuit (21) extending through the holder (40) and electrically connected to a FPC (50).

In the above image sense module, the plane top face of the glass plate can provide a good datum for the holder (40) for the light axis perpendicularly projecting to the semi-conductor image sense chip (10), and the skirt (41) can accurately position the semi-conductor image sense chip (10) for controlling the image collect area located in a lens projecting area that has a low image fault.

Although the invention has been explained in relation to its preferred embodiment, it is to be understood that many other possible modifications and variations can be made without departing from the spirit and scope of the invention as hereinafter claimed.

What is claimed is:

1. A flip chip package structure for an image sensor, comprising:
   a glass plate having a bottom face and a side edge portion extending transversely therefrom;
   a semi-conductor image sense chip having a top face opposing the bottom face of the glass plate, the semi-conductor image sense chip having multiple electric contacts formed thereon; and
   a conductive interconnection circuit formed on the bottom face of the glass plate, the conductive interconnection circuit having multiple first solder points each electrically connected to a corresponding one of the electric contacts of the semi-conductor image sense chip and multiple second solder points formed on one side of the glass plate, the multiple second solder points adapted to be electrically connected to a printed circuit;
   an opaque mask formed about the semi-conductor image sense chip to extend peripherally outward therefrom, the opaque mask peripherally wrapping the glass plate to cover the side edge portion thereof.

2. The flip chip package structure as claimed in claim 1, wherein the semi-conductor image sense chip has a periphery underfilled with jelly-like material to form an airtight condition.

3. The flip chip package structure as claimed in claim 2, wherein the electric contacts are bumps.

4. The flip chip package structure as claimed in claim 2, wherein the electric contacts are bonding pads and each has a metal soldering ball planted thereon.

5. The flip chip package structure as claimed in claim 1, wherein the multiple second solder points are arranged separately juxtaposed relative to one another.

6. The flip chip package structure as claimed in claim 1, wherein the multiple second solder points are arranged in an array.

7. An image sense module comprising:

a glass plate having a bottom face and a side edge portion extending transversely therefrom;

a semi-conductor image sense chip having a top face opposing the bottom face of the glass plate, the semi-conductor image sense chip having multiple electric contacts formed thereon;

a conductive interconnection circuit formed on the bottom face of the glass plate, the conductive interconnection circuit having multiple first solder points each electrically connected to a corresponding one of the electric contacts of the semi-conductor image sense chip and multiple second solder points formed on one side of the glass plate, the multiple second solder points adapted to be electrically connected to a print circuit;

an opaque mask formed about the semi-conductor image sense chip to extend peripherally outward therefrom, the opaque mask peripherally wrapping the glass plate to cover the side edge portion thereof; and a lens set secured on the glass plate, the lens set including a holder perpendicularly attached to a top face of the glass plate and having a skirt downward extending from the holder to define a channel at one side thereof for passage of the conductive interconnection circuit therethrough.

8. The image sense module as claimed in claim 7, wherein the electric contacts are bonding pads, and each has a metal soldering ball planted thereon.

9. The image sense module as claimed in claim 8, wherein the multiple second solder points are arranged separately juxtaposed relative to one another.

10. The image sense module as claimed in claim 8, wherein the multiple second solder points are arranged in an array.

11. The image sense module as claimed in claim 7, wherein the electric contacts are bumps.

12. The image sense module as claimed in claim 11, wherein the multiple second solder points are arranged separately juxtaposed relative to one another.

13. The image sense module as claimed in claim 11, wherein the multiple second solder points are arranged in an array.

* * * * *